(12) United States Patent
Ziglioli et al.

(10) Patent No.: US 8,324,007 B2
(45) Date of Patent: Dec. 4, 2012

(54) MANUFACTURING METHOD OF AN ELECTRONIC DEVICE INCLUDING OVERMOLDED MEMS DEVICES

(75) Inventors: Federico Giovanni Ziglioli, Gessate (IT); Mark Andrew Shaw, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 32 days.

(21) Appl. No.: 12/848,730

(22) Filed: Aug. 2, 2010

(65) Prior Publication Data

US 2010/0297797 A1    Nov. 25, 2010

Related U.S. Application Data

(62) Division of application No. 12/260,910, filed on Oct. 29, 2008, now abandoned.

(30) Foreign Application Priority Data

Oct. 30, 2007 (IT) .................................. MI07A2099

(51) Int. Cl.
*H01L 21/00* (2006.01)
(52) U.S. Cl. ................ 438/53; 438/49; 438/50; 438/51; 438/52; 257/414; 257/415; 257/416; 257/417; 257/418; 257/419; 257/420; 73/715
(58) Field of Classification Search .......... None
See application file for complete search history.

(56) References Cited

U.S. PATENT DOCUMENTS

| | | |
|---|---|---|
| 4,823,605 A | 4/1989 | Stein |
| 4,894,707 A | 1/1990 | Yamawaki et al. |
| 5,105,262 A | 4/1992 | Grider |
| 5,424,249 A | 6/1995 | Ishibashi |
| 5,622,873 A | 4/1997 | Kim et al. |
| 5,644,169 A | 7/1997 | Chun |
| 5,852,320 A | 12/1998 | Ichihashi |
| 5,897,338 A | 4/1999 | Kaldenberg |
| 5,948,991 A | 9/1999 | Nomura et al. |
| 6,300,155 B1 | 10/2001 | Taki et al. |
| 6,379,988 B1 * | 4/2002 | Peterson et al. ............... 438/51 |

(Continued)

FOREIGN PATENT DOCUMENTS

EP    0546435 A2    6/1993

(Continued)

OTHER PUBLICATIONS

"EPON Resin SU-8 (a.k.a. EPIKOTE 157)", Hexion Specialty Chemicals, Technical Data Sheet, SC: 1580-01, 4 pages.

(Continued)

*Primary Examiner* — N Drew Richards
*Assistant Examiner* — Michael Jung
(74) *Attorney, Agent, or Firm* — Seed IP Law Group PLLC

(57) ABSTRACT

A method manufactures an electronic device comprising a MEMS device overmolded in a protective casing. The MEMS device includes an active surface wherein a portion of the MEMS device is integrated, and is sensitive, through a membrane, to chemical/physical variations of a fluid. Prior to the molding step, at least one resin layer is formed on at least one region overlying the active surface in correspondence with the membrane. After, at least one portion of at least one resin layer is removed from at least one region, so that in the region an opening is formed, through which the MEMS device is activated from the outside of the protective casing.

17 Claims, 8 Drawing Sheets

U.S. PATENT DOCUMENTS

| | | |
|---|---|---|
| 6,395,585 B2 | 5/2002 | Brandl |
| 6,583,419 B1 | 6/2003 | Moy et al. |
| 6,777,767 B2 | 8/2004 | Badehi |
| 2002/0070464 A1 | 6/2002 | Frezza |
| 2005/0151244 A1 | 7/2005 | Chrysler et al. |
| 2006/0246416 A1 | 11/2006 | Tani et al. |
| 2006/0260408 A1 | 11/2006 | Villa et al. |
| 2007/0090473 A1 | 4/2007 | Engling et al. |
| 2007/0111365 A1* | 5/2007 | Tateishi et al. .......... 438/53 |
| 2007/0210392 A1 | 9/2007 | Sakakibara et al. |
| 2007/0222008 A1* | 9/2007 | Chen et al. .......... 257/415 |
| 2008/0157236 A1* | 7/2008 | Chen et al. .......... 257/415 |
| 2008/0315333 A1 | 12/2008 | Combi et al. |

FOREIGN PATENT DOCUMENTS

| | | |
|---|---|---|
| EP | 0813236 A1 | 12/1997 |
| JP | 04002152 | 1/1992 |
| JP | 09304211 | 11/1997 |
| WO | 20071023032 A1 | 3/2007 |
| WO | 2007042336 A2 | 4/2007 |

OTHER PUBLICATIONS

M. Despont et al., "High-Aspect-Ratio, Ultrathick, Negative-Tone Near-UV Photoresist for MEMS Applications," IEEE 1997, 5 pages.

F.G. Tseng et al., "A Novel Fabrication Method of Embedded Micro Channels Employing Simple UV Dosage Control and Antireflection Coating," IEEE 2002, pp. 69-72.

* cited by examiner

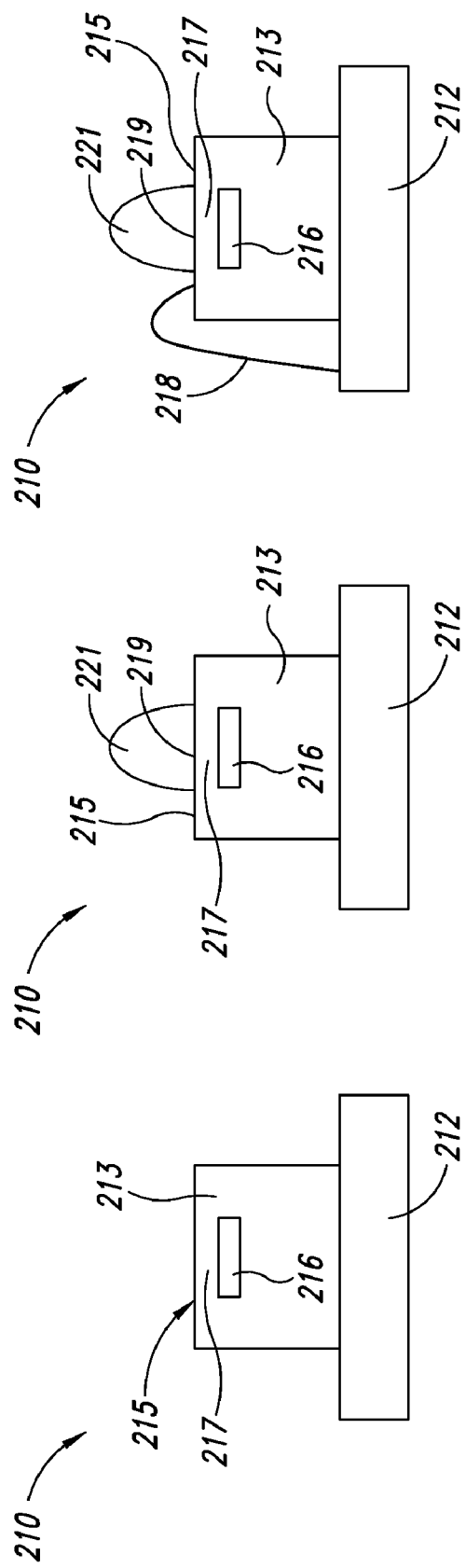

MANUFACTURING METHOD OF AN ELECTRONIC DEVICE INCLUDING OVERMOLDED MEMS DEVICES

BACKGROUND

1. Technical Field

The present invention relates to a method for manufacturing an electronic device comprising overmolded MEMS devices.

The invention also relates to an electronic device comprising overmolded MEMS devices.

The invention particularly, but not exclusively, relates to a method for manufacturing an electronic device comprising MEMS sensors mounted on an LGA substrate, wherein the MEMS sensor needs a physical interface to communicate with the outside of the electronic device and the following description is made with reference to this field of application by way of illustration only.

2. Description of the Related Art

As it is well known, a MEMS device (micro-electro-mechanical system) is a miniaturized device or, in any case, a device having micrometric size which integrates mechanical and electrical functions in a chip or die of semiconductor material, for example of silicon, and which is realized by using micro-manufacturing lithographic techniques. The final assembled device is typically made of the silicon die wherein the MEMS device is integrated and, optionally, of integrated circuits for specific applications mounted on a substrate, for example of the LGA or BGA type (Land Grid Array or Ball Grid Array), flanked to or piled onto the MEMS device, by using conventional assembling processes.

A cover or cap, fixed to the substrate, overmolds the MEMS device and the other devices mounted on the substrate, forming a casing which protects the MEMS device against external physical stresses.

If the MEMS device is a pressure, gas, liquid sensor or a microphone, the cover is provided with a window to allow the interaction between the device and the outside of the assembled device.

It is also known that the substrate of the LGA/BGA type is formed by conductive layers insulated from each other by means of layers of insulating or dielectric material. The conductive layers are shaped in conductive tracks insulated from each other by layers of insulating or dielectric material. Conductive through-holes, called "vias", typically realized through the insulating layers according to an orthogonal orientation with respect to the insulating layers, are provided to form conductive paths between conductive tracks belonging to different conductive layers.

The MEMS devices are then electrically connected with the outside of the final device through wires connecting contact pads provided on the MEMS devices with conductive tracks present on the substrate inside the cover.

A solution of this type is described for example in the PCT patent application, with publication number WO 2007/042336, filed on Apr. 26, 2006 by the assignee of the present application. In this patent application a MEMS device, in particular a pressure sensor, is realized on a substrate of the LGA type, to which it is glued, through a layer of epoxy glue. This sensor has a cavity above which there is a membrane and is connected to the substrate through metallic conductive wires. It is then covered by a closing wafer equipped with an opening in correspondence with the membrane of the sensor and through which the sensor is in communication with the outside. All the device is finally overmolded in a casing.

Although advantageous under several aspects, this solution shows different drawbacks. In fact, the complete device is made by first realizing a casing bottom, then the different components are affixed to the casing bottom, and finally the casing is molded and the element to control the sensor is inserted through the window of the casing. For these devices, moreover, the procedure of alignment and positioning of the window to introduce the element for controlling the sensor is rather complicated, making the realization of the device difficult to be reproduced. Moreover, the manufacturing process of these devices is complicated by the presence of different assembling steps and relatively expensive.

A second solution, described in U.S. Patent Application Publication No. 2002/0070464 to the assignee of the present application, provides the use of a casing which, by using a conventional technique, is equipped with a window in correspondence with an integrated electronic device, for example a sensor housed inside the casing and which must be put in communication with the outside of the casing. This window is obtained by using the same mold which is used to realize the casing; this mold is equipped with a protrusion projecting internally in correspondence with the sensor. After having fixed the sensor and a relative control circuitry to a semiconductor substrate, which serves as support, a surface of the sensor is covered with a coating layer formed by material of the elastic type. The substrate is inserted in the mold so that the protrusion is in correspondence and in contact with the coating layer. The mold is then filled in by injection with an insulating material to realize, in a single step, the casing with window.

Although meeting the aim, also this solution is not exempt from drawbacks, such as the reproducibility of the process, the stability of the shape of the dispensed elastic material, the reliability and the strength of the device which can, in fact, be subject to delaminations at the interface between the insulating material and the material of the elastic type.

Another technique for manufacturing a MEMS device overmolded in a casing uses a molding machine commercially known as "film assisted mold," which realizes the cap of the device thanks to a polymeric film, interposed between the mold and the device itself, which allows to expose the silicon in a remarkably controlled way.

The disadvantage of this solution consists in that the increase of the size of the holes made on the cap determines a weakening of the silicon slice which serves as cap, and a subsequent breakage of this one during the completion of the device.

Moreover, to ease the interaction between a MEMS device, for example a pressure sensor, and the fluid outside the casing overmolding it methods have been implemented for manufacturing micro-channels buried in the MEMS device, below the membrane or active element. A method which realizes buried micro-channels of this type is described in the patent application, with publication number U.S. 2006/0260408, filed on May 4, 2006 by the assignee of the present application.

A second method known for the formation of micro-channels is described in the U.S. Patent Application Publication No. 2006/0246416. According to this method, the micro-channels are formed in the substrate of a first "chip", called micro-porous "chip", which is then glued to a second "chip", called micro-fluidic "chip". A third example of formation of micro-channels is described in the U.S. Patent Application Publication No. 2005/0151244, wherein micro-channels are formed first in a "cooling plate" using to cool an electronic "chip".

It is known to realize micro-channels in a silicon substrate through the combination of suitably shaped layers.

Another aspect to be taken into account in the manufacturing of the MEMS devices, in particular in the ultra thin ones, or for "package" applications, is the use of photo-sensitive resins ("photo-resist") being very thick and with high "aspect ratio" (i.e.: with high ratio between width and height of the device, also known as "aspect ratio"), so as to obtain vertical walls in relatively high structures with a good control of the size on the whole height.

A known technique to obtain structures with high "aspect ratio" with sub-micron resolution in very thick "photo-resist" is the X-ray lithography, used in the LIGA process ("Lithography, Galvanoforming and Abformung") to form very thick layers of PMMA (polymethylmethacrylate). However, the cost of the manufacturing of a device, made by using the LIGA process with X-ray lithography, is strongly influenced by the high cost of the X-ray source (synchrotron radiation) and by the complex technology of the masks.

Recently, instead, a new type of "photo-resist", having characteristics similar to the PMMA and having the possibility of being used in a process of the LIGA type, is used for the applications of ultrathin MEMS with high "aspect ratio".

The characteristics of this new type of "photo-resist", called SU-8, are described in the publications "A Novel Fabrication Method of Embedded Micro Channels Employing Simple UV Dosage Control and Antireflection Coating", F. G. Tseng, Y. J. Chuang and W. K. Lin, 2002 IEEE; and "High-Aspect-Ratio, Ultrathick, Negative-Tone Near-UV Photoresist for MEMS Applications," M. Despont, H. Lorenz, N. Fahrni, J. Brugger, P. Renaud and P. Vettiger, 1997 IEEE.

The SU-8 is a "photo-resist" similar to the epoxy resin, sensitive to the radiation near the UV and based onto the resin EPON SU-8 (from "Shell Chemical"). The fundamental characteristic, which makes the SU-8 useful for the ultrathick "photo-resist" applications, is its very low optical absorption in a range of radiations near the UV, which determines uniform exposure conditions according to the thickness, allows to form perfectly vertical walls and to have a good size control on the height of the whole formed structure. Another advantage of the SU-8 is its capacity of self-planarization during the "prebake" and then to eliminate the "edge-bead" effect, determining a good contact between the mask and the "photo-resist" in the contact lithography.

As reported in the second one of the above publications, it has been proved that, with a coating having single SU-8 layer, thicknesses can be obtained, in a reproducible way, of more than 500 µm and that even thicker "photo-resist" can be obtained through multiple coatings, up to 1200 µm of thickness with a double-layer coating. The "aspect ratio" found for structures exposed to the radiation near the UV (400 nm) can be greater than 18 and remains constant for a thickness comprised between 80 and 1200 µm.

BRIEF SUMMARY

One embodiment is a device comprising overmolded MEMS devices, having such structural and functional characteristics as to allow the realization of this electronic device with low-cost manufacturing processes overcoming the limits and/or the drawbacks still affecting the electronic devices realized according to the prior art.

One embodiment is a method for manufacturing an electronic device comprising overmolding MEMS devices, wherein the opening putting the MEMS device in communication with the outside is realized through photolithography with "photo-resist" thick layers, for example of the type known as SU-8.

One embodiment is a method for manufacturing an electronic device which comprises a MEMS device overmolded in a protective casing, the MEMS device comprising an active surface wherein a portion of said MEMS device is integrated, said MEMS device being sensitive, through a membrane, to chemical/physical variations of a fluid.

The method comprises the steps of:
forming, prior to the molding step, at least one photo-resist resin layer on at least one central region overlying said active surface in correspondence with said membrane;
removing at least one portion of said at least one resin layer from said at least one central region, so that in said region an opening is formed, through which the MEMS device is activated from the outside of said protective casing.

One embodiment is an electronic device which comprises a MEMS device overmolded in a protective casing, said MEMS device comprising an active surface wherein a portion of said MEMS device is integrated, said MEMS device being sensitive through a membrane, to chemical/physical variations of a fluid. The MEMS device is activated from the outside of said protective casing through an opening placed between at least one first and at least one second resin layer, in correspondence with said membrane. The characteristics and the advantages of the method and of the device will be apparent from the following description of their respective embodiments given by way of indicative and non-limiting example with reference to the annexed drawings.

BRIEF DESCRIPTION OF THE SEVERAL VIEWS OF THE DRAWINGS

In these drawings:

FIGS. 4A-4E show an application of the steps of the second implementation example of the manufacturing method of a second embodiment of the electronic device comprising MEMS devices;

DETAILED DESCRIPTION

Figure 1A:
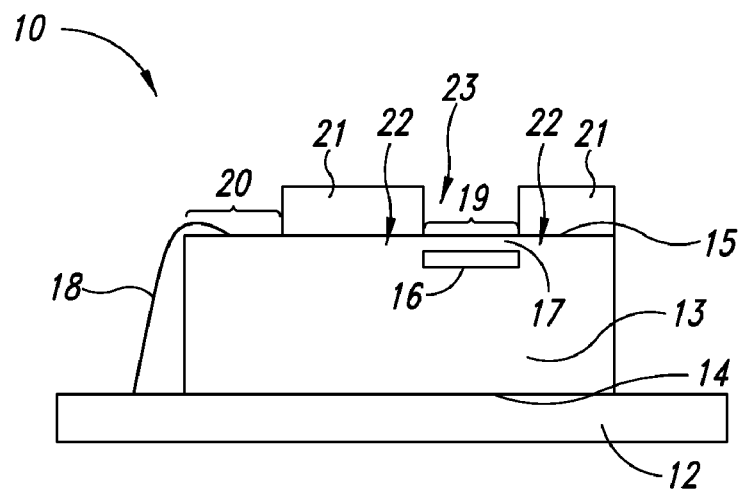
FIGS. 1A, 1B show the steps of a first implementation example of the manufacturing method of a first embodiment of the electronic device comprising MEMS devices.
Figure 1B:
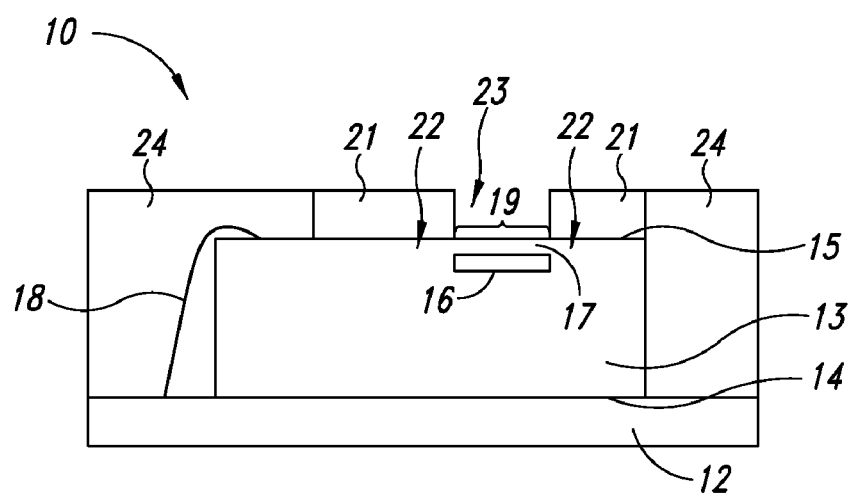

With reference to FIGS. 1A and 1B, the steps are shown of a first implementation example of the manufacturing method of a first embodiment of the electronic device comprising a MEMS device.

Hereafter in the description it will be apparent that the method can be implemented to obtain indifferently a first or a second embodiment of an electronic device incorporating MEMS devices.

In the following description it is also taken for granted that the MEMS device has already been realized above a semiconductor substrate of the electronic device housing it.

FIG. 1A shows a first implementation step of the method which provides the formation of a photo-resist resin layer above the MEMS device comprised in the electronic device and the successive partial removal of this resin layer prior to the overmolding of the device in a protective casing.

In particular, a substrate 12 has been shown, for example of the LGA/BGA type comprising an insulating core of a polymeric material (for example triazine and bismaleimide resin (BT)) and coated by metallic layers, for example of copper, wherein, according to conventional techniques, conductive tracks are shaped, not shown in the figure. Above the substrate 12 a MEMS device 13 is glued serving as sensor, i.e., it is sensitive to chemical and/or physical variations of a fluid present outside the electronic device. The MEMS device 13 is integrated in a die, for example of silicon, and has a non-active surface 14 and an active surface 15, opposed to the non-active surface 14, below which a cavity 16 is present. Above the cavity 16 there is a membrane 17 having a top surface that is part of the active surface 15.

Advantageously, on the whole active surface 15 of the MEMS sensor 13 a photo-resist resin layer 21 is deposited, for example of the SU-8 type, through the "spin coating" technique.

The fundamental characteristic, which makes the SU-8 useful for the ultrathick "photo-resist" applications, is its very low optical absorption in a range of radiations near the UV, which determines uniform exposure conditions according to the thickness, allows to form perfectly vertical walls and to have a good size control on the height of the whole formed structure. Another advantage of the SU-8 is its capacity of self-planarization.

Advantageously, the resin layer 21 deposited has a relatively high thickness greater than 20 μm.

Advantageously, the resin layer 21 deposited has a greater thickness than the maximum height of the metallic wires 18, which is equal to 150 micrometers.

Subsequently, the resin layer 21 is exposed to a radiation near in the spectrum to UV radiation and an etching of the chemical type or the "ashing" technique, to remove the excess resin layer from a central region 19, overlying the active surface 15 in correspondence with the membrane 17, and from a peripheral region 20 overlying a peripheral portion of the active surface 15. This peripheral region 20, is, in fact, apt to house metallic wires 18 serving as electric connections between the MEMS sensor 13 and the substrate 12, which has suitable pads, not shown in the figure, which are connected to the conductive tracks through these conductive wires 18.

Finally, a first and a second portion of the resin layer 21 are left in correspondence with regions 22 overlying the active surface 15 and adjacent to the central region 19, so that an opening 23 is formed in correspondence with the central region 19, which allows the interaction of the sensor 13, through the membrane 17, with an external fluid.

Advantageously, in one embodiment the resin layer is deposited by means of the known technique of "screen printing".

Advantageously, in one embodiment the resin layer is deposited by means of the known technique of "dispensing".

Subsequently, as shown in FIG. 1B a molding step of a protective casing ("molding") is carried out, through conventional techniques. An electronic device 10 is thus formed which, in the end, includes the MEMS device 13 overmolded inside a protective casing or "package" 24. In particular, the protective casing 24 comprises the MEMS device 13, overlaid by the two residual portions of the resin layer 21, the electric connections 18 and the substrate 12, leaving the opening 23 exposed in correspondence with the membrane 17 of the MEMS device 13.

Figure 2:
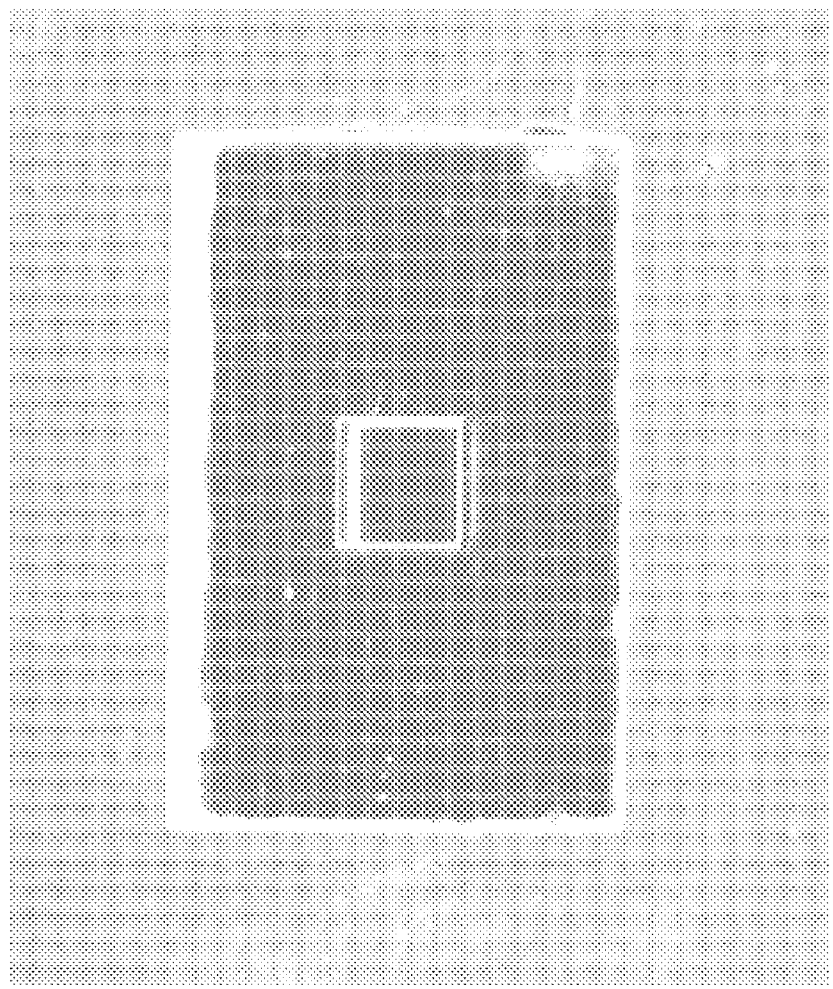
FIG. 2 shows a TEM image (Transmitted Electronic Microscopy) from above of the first embodiment of the electronic device of FIG. 1 comprising MEMS devices.

FIG. 2 shows a TEM image from above of the electronic device 10.

Figure 3A:
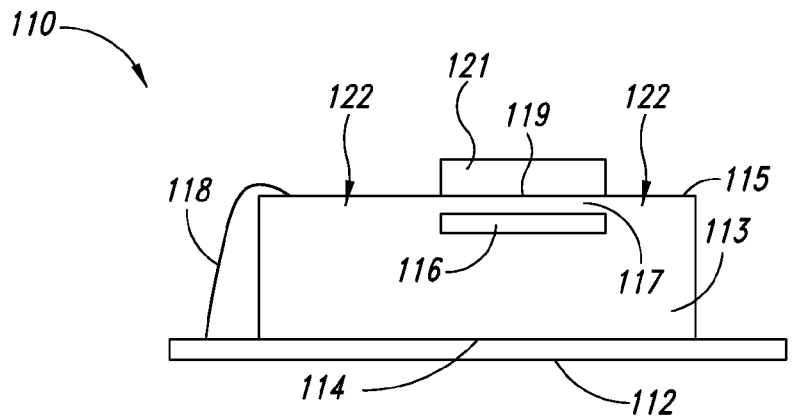
FIGS. 3A-3C show the steps of a second implementation example of the manufacturing method of a second embodiment of the electronic device comprising MEMS devices.
Figure 3B:
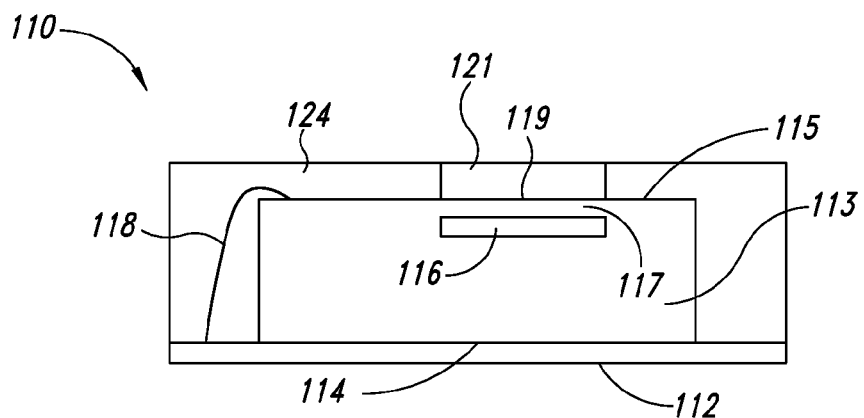
Figure 3C:
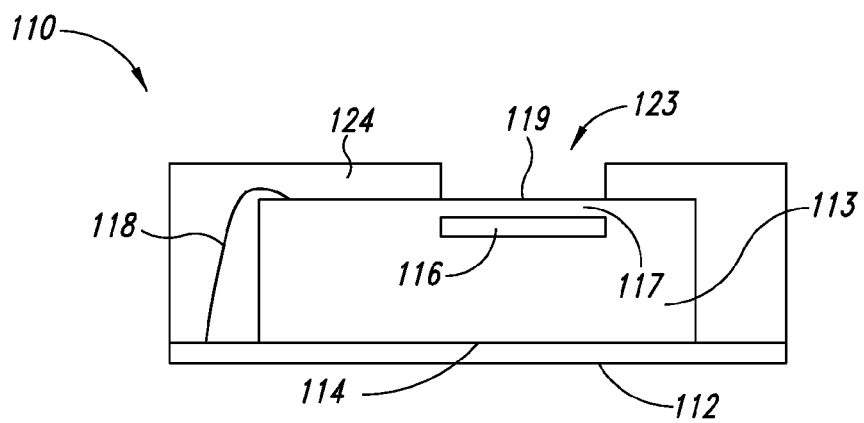

With reference to FIGS. 3A-3C, the steps are shown of a second implementation example of the manufacturing method leading to a second embodiment of the electronic device comprising MEMS devices. This second implementation example provides the formation of the resin layer on a portion of the MEMS device in correspondence with the active membrane and the successive removal of this resin layer after the overmolding of the device in a protective casing.

FIG. 3A shows a first step of the second implementation example of the method. On a substrate 112 is glued a MEMS device 113 serving as sensor. The MEMS device 113 is integrated in a die, for example of silicon, and has a non-active surface 114 and an active surface 115 opposed to the non-active surface 114. Below the active surface 115, there is a cavity 116, above which there is a membrane 117. The MEMS sensor 113 is connected, through conductive wires 118, to the substrate 112 which has pads, not shown in the figure, connected to the conductive tracks.

Advantageously, a photo-resist resin layer 121, for example of the SU-8 type, is deposited on a region 119 overlying the active surface 115 of the MEMS sensor 113 in correspondence with the membrane 117, while regions 122 overlying the active surface 115 and adjacent to the region 119 are not coated by the photo-resist resin.

Advantageously, the resin layer 121 deposited has a relatively high thickness greater than 20 μm.

Advantageously, the resin layer 121 deposited has a thickness greater than the maximum height of the metallic conductive wires 118, which is equal to 150 micrometers.

Advantageously, according to one embodiment, the resin layer 121 is deposited through the "spin coating" technique.

Advantageously, according to one embodiment, the resin layer 121 is deposited through conventional photolithography.

Advantageously, according to one embodiment, the resin layer 121 is deposited through the "screen printing" technique.

Advantageously, according to one embodiment, the resin layer is deposited through the "dispensing" technique.

Subsequently, as shown in FIG. 3B, the molding step is carried out, through conventional "molding" techniques, in which inside a protective casing or "package" 124, the MEMS device 113, the electric connections 118 and the substrate 112, are encompassed leaving the resin layer 121 exposed in correspondence with the membrane 117 of the MEMS device 113.

Subsequently, a final cleaning step is carried out in which the resin layer 121 is totally removed from the region 119 and, in its place, an opening 123 is formed which allows the interaction of the sensor 113 with an external fluid. FIG. 3C, corresponding to this step, shows the electronic device 110 thus obtained.

FIGS. 4A-4E show, by way of example, the steps relative to an application of the second implementation example of the manufacturing method, in case the "dispensing" technique is used for depositing the resin layer.

In particular, FIG. 4A shows the gluing step, through the known "flip-chip" technique, between a substrate 212 and a MEMS sensor 213 having an active surface 215, below which there are a cavity 216 and a membrane 217 placed above the cavity 216. This gluing step is followed, as shown in FIG. 4B, by a distribution step of photo-resist resin, such as to form an ovoidal region of resin 221 above a region 219 overlying the active surface 215 in correspondence with the membrane 217.

Advantageously, the photo-resist resin used to form the ovoidal region 221 is of the SU-8 type.

This resin region 221 is subsequently subjected to a "curing" thermal process, followed by a step, shown in FIG. 4C, of electrochemical cleaning, through "plasma cleaning" and of formation of metallic connections 218 between the MEMS sensor 213 and the substrate 212 through "wire bonding".

Figure 4E:
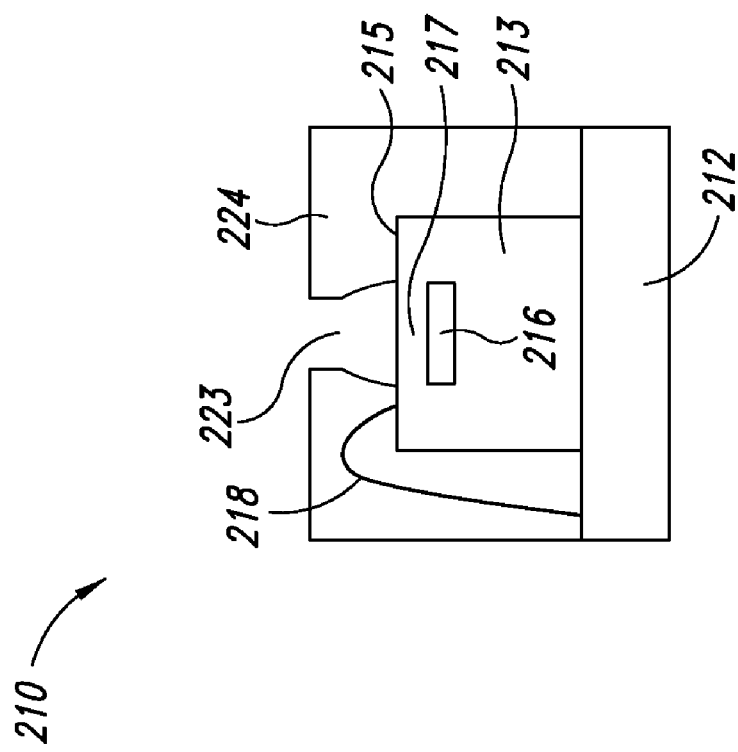
Figure 4D:
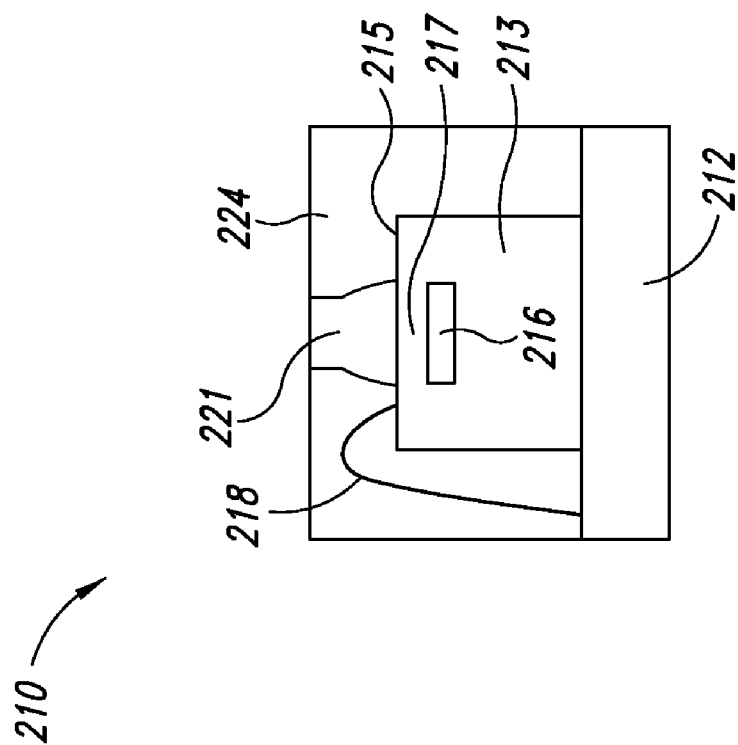

FIG. 4D shows the overmolding step, through conventional "molding" techniques, inside a protective casing or "package" 224, of the MEMS device 213, of the electric connections 218 and of the substrate 212, leaving the resin ovoidal region 221 exposed.

A final cleaning step follows, from which the device 210 shown in FIG. 4E is obtained, wherein the resin region 221 is totally removed, leaving an opening 223 in correspondence with the region 219, which allows the interaction of the sensor 213 with an external fluid.

Figure 5A:
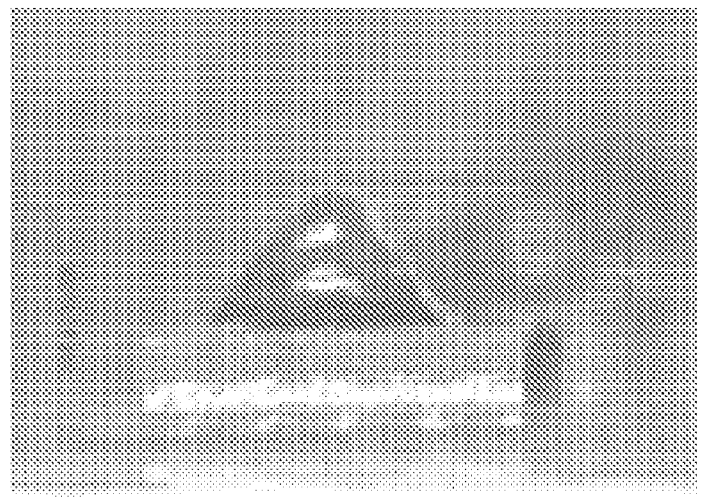
FIGS. 5A, 5B show the TEM images of two portions of the device obtained with this implementation example of the method.
Figure 5B:
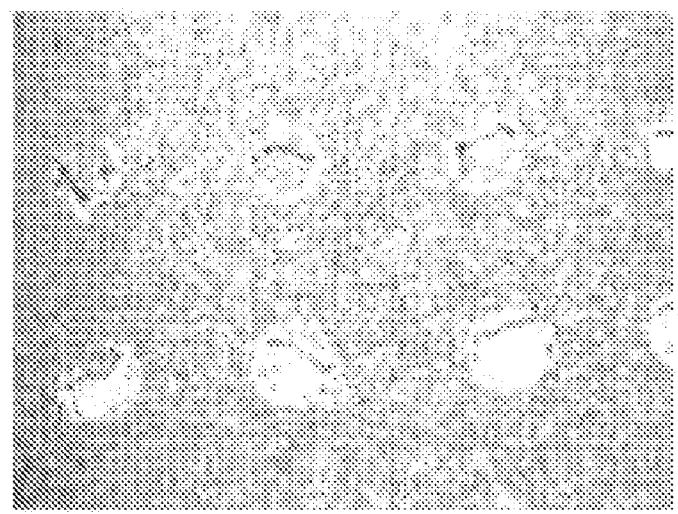

FIGS. 5A, 5B show two TEM images (Transmitted Electronic Microscopy) of two portions of the device 210. In particular, FIG. 5A shows the TEM image of the step shown in FIG. 4C, while FIG. 5B shows the TEM image from above of a stripe of the device 210.

The method has a further advantage in that it allows to realize a device comprising three-dimensional micro-channels which create a preferred path for the passage of a fluid coming from the outside of the device.

Figure 6:
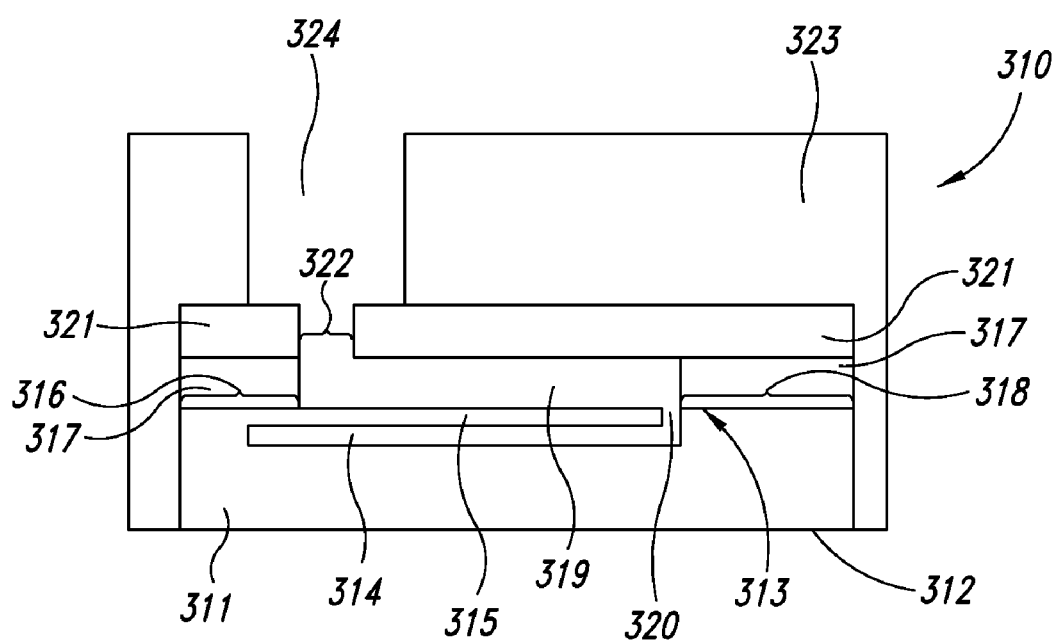
FIG. 6 shows a section of an electronic device realized with the method.

FIG. 6 shows for example a section of an electronic device 310 comprising buried micro-channels, realized with the first implementation example of the method.

In particular, the device 310, which can be a pressure or gas sensor device, comprises a monolithic silicon body 311, having a lower surface 312 and an upper surface 313 and comprising a buried cavity 314 which is extended to a certain distance from the upper surface 313 and delimits with the upper surface a flexible membrane 315.

On a first lateral region 316 of the upper surface 313 there is a first portion of a first photo-resist resin layer 317 and on a second lateral region 318 of the upper surface 313 there is a second portion of a first photo-resist resin layer 317, formed with the method described in FIGS. 1A and 1B. Between the two portions of the first resin layer 317 a channel region 319 is interposed which communicates through an access opening 320 with the buried cavity 314, forming a micro-channel structure. On the portion of resin layer 317 overlying the lateral region 316 there is a first portion of a second resin layer 321, which is exactly overlapped onto the first portion of resin layer 317. On the portion of resin layer 317 overlying the lateral region 318 there is a second portion of the second resin layer 321, which extends beyond the resist layer 317, projecting onto the channel region 319, and is separated from the first portion of the second resin layer 321, through a space 322 communicating with the channel region 319. The portions of the second resin layer 321 are formed by reiterating the method of FIGS. 1A and 1B. Subsequently, the "film assisted molding" is carried out leaving the first resin layer 317 exposed.

The device 310 is overmolded, together with the portions of the first and of the second resin layer 317 and 321, in a protective casing or "package" 323 which has an opening 324 in correspondence with the space 322, through which a fluid present outside the package 324 penetrates inside the channel region 319.

Figure 7:
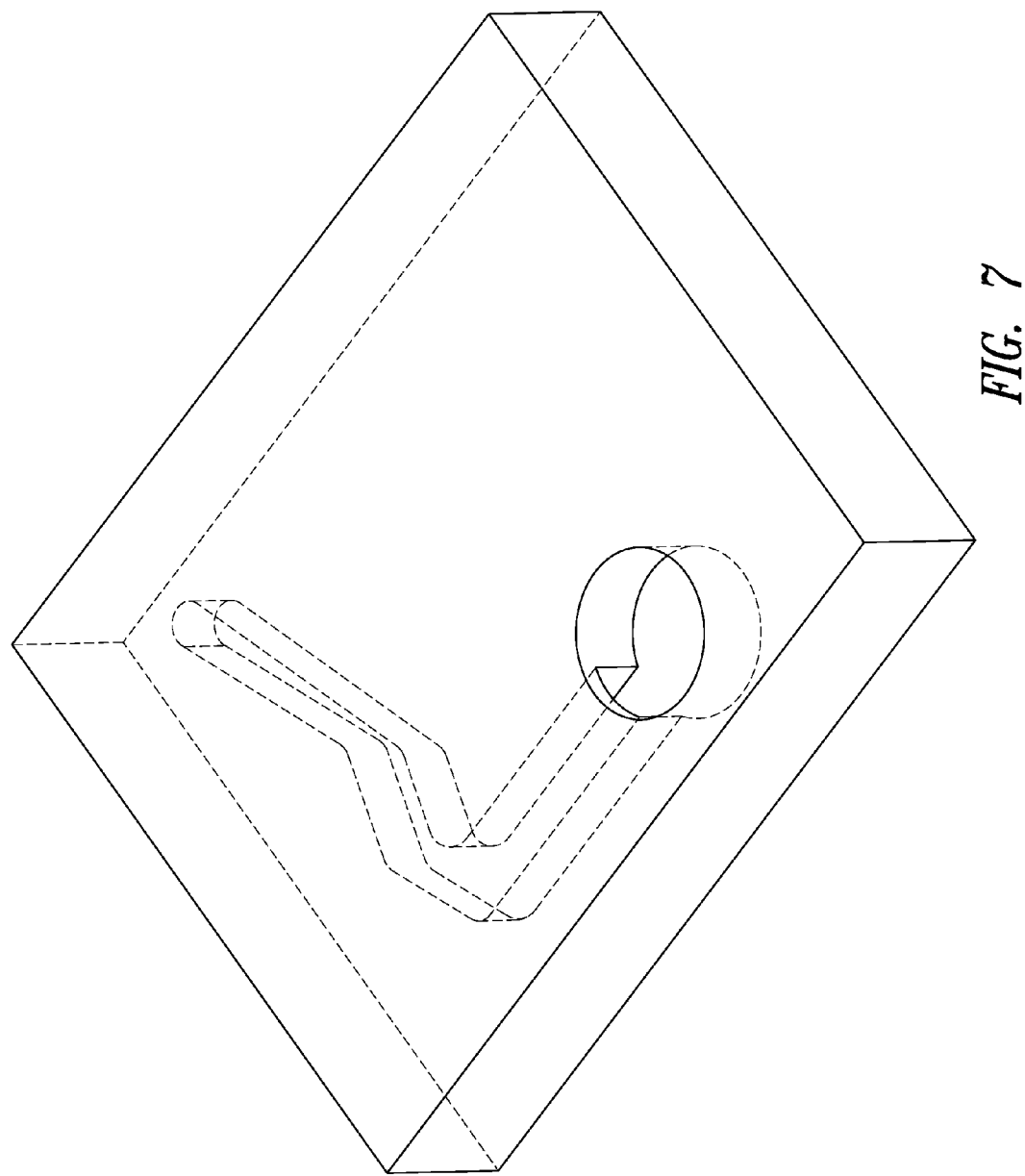
FIG. 7 shows a three-dimensional view of the buried micro-channels, realized with the method.

The micro-channels are realized by using a standard photolithography. With at least two resin layers a complex structure with three-dimensional channels is realized, like the one shown in FIG. 7.

In conclusion, the method allows to realize economic pressure sensors with other "aspect ratios".

With the method it is also possible to realize on the chip a preferred path for gases or liquids flowing inside the package up to the sensor. This method, in fact, can be applied to gas, pressure and chip sensors used in micro-fluidic applications.

Moreover, the sizes of the channels and of the surface etched in the silicon are smaller, of at least one order of magnitude, than the structure realized with the device overmolding technologies, have the photolithographic accuracy and are compatible with the front end processes.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising
    forming a MEMS device having a membrane sensitive to chemical or physical variations of a fluid;
    forming a first resin layer on said membrane;
    forming a first opening extending through the first resin layer above the membrane;
    forming a second resin layer on the first resin layer;
    forming a second opening extending through the second resin layer and in fluid communication with the first opening; and
    molding a protective casing on the MEMS device after forming the first and second resin layers, the protective casing being in contact with the second resin layer.

2. A method according to claim 1, wherein:
    forming the MEMS device includes:
        forming a cavity underlying the membrane; and
        forming a third opening adjacent to a side of the membrane and in fluid communication with the cavity; and
    forming the first opening includes forming a channel in the first resin layer, the channel being in fluid communication with the cavity via the second opening.

3. A method according to claim 1, wherein molding the protective casing includes forming the protective casing with a third opening in fluid communication with the second opening.

4. A method according to claim 1, wherein forming the first opening is performed prior to molding said protective casing.

5. A method, comprising
    forming a MEMS device having a membrane sensitive to chemical or physical variations of a fluid;
    forming a first resin layer on said membrane;

forming a first opening that extends completely to the membrane, wherein forming the first opening includes removing at least a first portion of said first resin layer from said membrane; and molding a protective casing on the MEMS device after forming the first resin layer, the protective casing being in contact with the first resin layer, wherein:

forming the MEMS device includes:
forming a cavity underlying the membrane; and
forming a second opening adjacent to a side of the membrane and in fluid communication with the cavity;

forming the first opening includes forming a channel in the first resin layer, the channel being in fluid communication with the cavity via the second opening;

forming the cavity includes forming the cavity on a first side of the membrane;

forming the channel includes forming the channel on a second side of the membrane, the second side being an opposite side of the membrane compared to the first side;

forming the first opening includes forming the first opening on the second side the membrane; and forming the second opening includes forming the second opening along a lateral side of the membrane, the lateral side coupling the first side to the second side.

6. A method according to claim 1, wherein forming the first resin layer comprises depositing the first resin layer simultaneously on said membrane, on a peripheral region overlying an active surface of the MEMS device, and on first and second regions of said active surface that are adjacent to said membrane.

7. A method according to claim 1, wherein said first opening is an opening in said first resin layer.

8. A method according to claim 1, wherein removing at least the first portion of said first resin layer is performed prior to molding said protective casing.

9. A method according to claim 1, wherein forming said first resin layer comprises depositing said first resin layer with a spin coating technique.

10. A method according to claim 1, wherein removing at least the portion of the first resin layer includes etching the resin layer.

11. A method according to claim 1, wherein forming said first resin layer comprises depositing said first resin layer with a dispensing technique.

12. A method according to claim 1, wherein forming said first resin layer comprises depositing said first resin layer through photo-lithography.

13. A method according to claim 1, wherein said first resin layer is photo-sensitive to near-UV radiation.

14. A method according to claim 1, wherein said first resin layer is an SU-8 resin layer.

15. A method according to claim 1, wherein said first resin layer has a thickness greater than 20 μm.

16. A method according to claim 1, wherein said first resin layer has a thickness greater than 150 μm.

17. A method according to claim 1, further comprising:
forming a MEMS device having a membrane sensitive to chemical or physical variations of a fluid;
forming a first resin layer on said membrane;
forming a first opening that extends completely to the membrane, wherein forming the first opening includes removing at least a first portion of said first resin layer from said membrane;
molding a protective casing on the MEMS device after forming the first layer, the protective casing being in contact with the first resin layer, wherein:
forming the MEMS device includes:
forming a cavity underlying the membrane; and
forming a second opening adjacent to a side of the membrane and in fluid communication with the cavity; and
forming the first opening includes forming a channel in the first resin layer, the channel being in fluid communication with the cavity via the second opening;
forming a second resin layer directly on the first resin layer; and
forming a third opening in the second resin layer, the third opening being in fluid communication with the channel, wherein molding the protective casing includes forming the protective casing with a fourth opening in fluid communication with the third opening.

* * * * *

UNITED STATES PATENT AND TRADEMARK OFFICE
CERTIFICATE OF CORRECTION

PATENT NO. : 8,324,007 B2  
APPLICATION NO. : 12/848730  
DATED : December 4, 2012  
INVENTOR(S) : Federico Giovanni Ziglioli et al.

Page 1 of 2

It is certified that error appears in the above-identified patent and that said Letters Patent is hereby corrected as shown below:

Item (56):
"WO  20071023032  A1  3/2007" should read, --WO  2007/023032  A1  3/2007--.

Column 9, Line 27:
"6. A method according to claim 1, wherein forming the first" should read, --6. A method according to claim 5, wherein forming the first--.

Column 9, Line 33:
"7. A method according to claim 1, wherein said first opening" should read, --7. A method according to claim 5, wherein said first opening--.

Column 9, Line 35:
"8. A method according to claim 1, wherein removing at" should read, --8. A method according to claim 5, wherein removing at--.

Column 9, Line 38:
"9. A method according to claim 1, wherein forming said" should read, --9. A method according to claim 5, wherein forming said--.

Column 9, Line 41:
"10. A method according to claim 1, wherein removing at" should read, --10. A method according to claim 5, wherein removing at--.

Column 10, Line 1:
"11. A method according to claim 1, wherein forming said" should read, --11. A method according to claim 5, wherein forming said--.

Signed and Sealed this  
Twenty-sixth Day of February, 2013

Teresa Stanek Rea  
*Acting Director of the United States Patent and Trademark Office*

Column 10, Line 4:
"12. A method according to claim 1, wherein forming said" should read, --12. A method according to claim 5, wherein forming said--.

Column 10, Line 7:
"13. A method according to claim 1, wherein said first resin" should read, --13. A method according to claim 5, wherein said first resin--.

Column 10, Line 9:
"14. A method according to claim 1, wherein said first resin" should read, --14. A method according to claim 5, wherein said first resin--.

Column 10, Line 11:
"15. A method according to claim 1, wherein said first resin" should read, --15. A method according to claim 5, wherein said first resin--.

Column 10, Line 13:
"16. A method according to claim 1, wherein said first resin" should read, --16. A method according to claim 5, wherein said first resin--.

Column 10, Line 15:
"17. A method according to claim 1, further comprising:" should read, --17. A method, comprising:--.